United States Patent [19]
Mikoshiba et al.

[11] Patent Number: 4,471,255
[45] Date of Patent: * Sep. 11, 1984

[54] SURFACE ACOUSTIC WAVE PARAMETRIC DEVICE

[75] Inventors: Nobuo Mikoshiba, Sendai; Shoichi Minagawa, Ageo, both of Japan

[73] Assignee: Clarion Co., Ltd., Tokyo, Japan

[*] Notice: The portion of the term of this patent subsequent to Nov. 11, 1997 has been disclaimed.

[21] Appl. No.: 201,127

[22] Filed: Oct. 27, 1980

Related U.S. Application Data

[63] Continuation-in-part of Ser. No. 948,826, Oct. 5, 1978, Pat. No. 4,233,530.

[51] Int. Cl.³ .............................................. H03H 9/72
[52] U.S. Cl. ................................. 310/313 R; 330/5.5; 333/152
[58] Field of Search ...................... 330/5.5; 353/153.4; 364/821; 357/26; 310/334, 313 R; 333/152, 154; 331/107 A; 358/188; 455/263

[56] References Cited
U.S. PATENT DOCUMENTS

| | | | |
|---|---|---|---|
| 3,679,985 | 7/1972 | Fang et al. | 330/4.6 |
| 3,862,431 | 1/1975 | Quote et al. | 307/88.3 |
| 3,882,408 | 5/1975 | Auld | 330/5.5 |
| 4,005,376 | 1/1977 | Davis | 333/152 |
| 4,233,530 | 11/1980 | Mikoshiba et al. | 307/424 |
| 4,288,765 | 9/1981 | Mikoshiba et al. | 333/195 |
| 4,398,114 | 8/1983 | Minagawa et al. | 310/313 R |
| 4,426,732 | 1/1984 | Mori | 330/5.5 |

Primary Examiner—J. D. Miller
Assistant Examiner—D. L. Rebsch
Attorney, Agent, or Firm—Russell E. Hattis

[57] ABSTRACT

An surface acoustic wave device, especially amplifier which includes input and output means for electrical signals provided so as to be spaced on a surface of a piezoelectric material which comprises a laminate in combination with a semiconductor, and an electrode provided in a surface signal wave propagation path between said input and output means for supplying pumping power.

13 Claims, 4 Drawing Figures

SURFACE ACOUSTIC WAVE PARAMETRIC DEVICE

RELATED APPLICATION

This application is a continuation-in-part application of Ser. No. 948,826, filed Oct. 5, 1978, entitled Elastic Surface Wave Device, Now U.S. Pat. No. 4,233,530, granted Nov. 11, 1980.

BACKGROUND OF THE INVENTION

1. Field of the Invention

This invention relates to an surface acoustic wave device, and more particularly to an surface acoustic wave device operative by a parametric amplifying effect.

2. Description of the Prior Art

An surface acoustic wave (elastic surface wave) amplifier is a solid-state amplifier which generally employs a piezoelectric semiconductor or a suitable combination of a semiconductor and a piezoelectric material, and attains a desired amplification effect by interaction between an surface acoustic wave (hereinafter referred to as "surface wave") and a semiconductor charge.

In a conventional surface wave amplifier, a piezoelectric material such as lithium niobate and a semiconductor are disposed oppositely so as to be spaced a distance of about 1,000 Å, and a d.c. voltage is applied to the semiconductor in a direction along the surface of the semiconductor which defines the region to accomplish an amplifying operation by the interaction between a semiconductor charge and a surface wave caused by such application of the d.c. voltage.

This conventional amplifier, however, has the defect that continuous wave operation cannot be obtained due to Joule heat generated by the d.c. current. It has another difficulty in integration because of its non-monolithic structure.

There have been other conventional devices than that of d.c. voltage-application type, which utilize a parametric amplification effect. One of them is so constructed that a semiconductor material such as Si is provided in the propagation path of travelling waves on a piezoelectric material through a conductive liquid and so operated that a surface signal wave and pumping wave (propagated wave) are propagated in the same direction at a portion of the piezoelectric material and a space capacitance nonlinearity at a portion of the semiconductor is utilized to attain amplification of the surface signal wave.

This device, however, has such disadvantages that since the frequency of the pumping wave is much higher than that of the surface signal wave, there is some difficulty in the preparation of transducers for generating the pumping waves, and that since necessary pumping power is increased due to generation of harmonic components of the pumping wave, there is caused some disadvantage in actual operation. It has further disadvantages in integration, too.

Another type of conventional parametric amplifier is so operated that with respect to a surface wave signal propagating on a piezoelectric material, an exciting voltage is applied to a metal electrode provided in the propagation path for exciting the piezoelectric material at the relevant portion, thereof, thereby amplifying the surface signal wave propagating through the piezoelectric material due to a nonlinear effect of the piezoelectric material.

OBJECT OF THE INVENTION

It is an object of the present invention to provide an elastic surface wave device which is capable of producing continuous waves.

It is another object of the present invention to provide an elastic surface wave device which is capable of attaining conversion in an ultra-high frequency band effectively.

It is still another object of the present invention to provide an elastic surface wave device which is capable of eliminating the minute processing heretofore necessitated.

SUMMARY OF THE INVENTION

In accordance with the present invention, there is provided an elastic surface wave device comprising: a laminate composed of a semiconductor layer and a piezoelectric material layer; a first electrode provided on the propagating path of surface acoustic waves in said laminate; and means for supplying a high frequency pumping electric power to said electrode, thereby causing a surface charge layer capacitance formed at the surface portion of said semiconductor layer to vary.

PREFERRED EMBODIMENTS OF THE INVENTION

Figure 1:
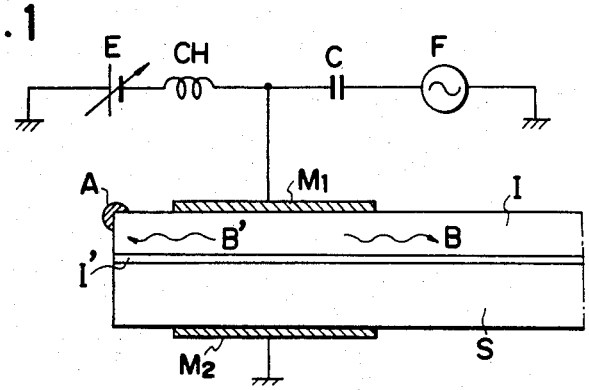
FIG. 1 is an electrical circuit diagram, showing a preferred form of an elastic surface wave device in accordance with the present invention.

Referring now to the drawings, there are illustrated preferred embodiments of the present invention.

In FIG. 1, character S designates a semiconductor substrate made of, for example, silicon (Si) etc., I a piezoelectric film made of zinc oxide (ZnO) etc., and I' a protective film such as a silicon dioxide ($SiO_2$) film. The protective film I' acts as a stabilizing film for the surface of the semiconductor substrate S.

The semiconductor substrate S, the protective film I' and the piezoelectric film I comprise a laminate.

The laminate may alternatively have such construction that a piezoelectric material is used as a substrate and a semiconductor film is formed in a suitable manner on the piezoelectric substrate.

The semiconductor substrate S may be either p-type or n-type. In accordance with the type employed, a polarity of a d.c. base voltage as mentioned later may be determined so as to produce a space charge layer at the surface portion of the semiconductor substrate S.

$M_1$ on the piezoelectric film I is a metal electrode for supply of a d.c. bias voltage from a variable voltage source E and an a.c. electrical signal from a signal source F. The metal electrode $M_1$ is formed in a thin film, for example by evaporation.

$M_2$ is an electrode for an ohmic contact with the semiconductor substrate S.

The electrode $M_1$ is connected to the variable voltage source E through a choke coil CH for choking off a.c. current.

This electrode $M_1$ is further connected to the signal source I through a capacitor C for preventing a d.c. current flow in this branch.

Character A designates a sound wave (surface wave) absorber, for example made of silicone grease. This sound wave absorber A acts to absorb one of surface waves B and B' propagating in the opposite direction, i.e. surface wave B' in the embodiment of FIG. 1, so as to operate the device as a unidirectional surface elastic wave transducer.

The resulting surface wave device in accordance with the present invention will operate as follows:

Explanation will be given referring to the case where an a.c. electrical signal is converted to a surface signal wave.

A suitable value of d.c. bias voltage is first applied from the variable voltage d.c. power source E to the electrode $M_1$ to impart to the semiconductor substrate S at its interfacial surface portion a surface charge layer forming a nonlinear capacitance.

When an a.c. electrical signal having a frequency f is then supplied from the a.c. electrical signal source F to the electrode $M_1$, surface signal waves B and B' of a frequency f/2 are generated by the parametric interaction between the power of the a.c. electrical signal and the non-linear surface charge layer capacitance. These surface signal waves B and B' are propagated in directions right and left of the electrode $M_1$ as viewed in FIG. 1.

At this time, if the frequency of the a.c. electrical signal to be supplied to the electrode $M_1$ is selected so as to be 2f, the frequency of the surface signal waves B and B' converted is f. Thus, when the frequency of the a.c. electrical signal is varied over a wide range, the surface signal waves B and B' having the corresponding frequency are generated.

The amplitude of the converted surface signal waves B and B' varies depending upon the length of the electrode $M_1$ in the propagation direction of the surface signal waves and the gain of the nonlinearity at the surface portion of the substrate.

The gain of the nonlinearity is determined by the surface charge layer capacitance, which is in turn determined by a d.c. bias voltage value and the amount of the a.c. electrical signal power to be supplied.

Accordingly, in practical implementation, the frequency and power of the a.c. electrical signal and the gain of the nonlinearity may be suitably selected to produce a surface signal wave of the corresponding frequency and amplitude.

Furthermore, when a sound wave absorber A is mounted on one end of the piezoelectric material as shown in FIG. 1, the surface signal wave B' propagating in the direction towards the absorber is absorbed and not reflected, so that there is provided an unidirectional elastic surface wave transducer.

The foregoing description is given referring only to the conversion from an a.c. electrical signal to a surface signal wave, the conversion in the opposite direction, i.e., from a surface signal wave to an a.c. electrical signal is accomplished in substantially the same manner.

Though the piezoelectric material I is made of zinc oxide in the illustrated embodiment, it may alternatively be made of other piezoelectric materials such as lithium niobate ($LiNbO_3$), aluminum nitride (AlN), cadmium sulfide (CdS), zinc sulfide (ZnS), etc.

In the light of the foregoing description, it is easily understood that in accordance with the present invention, a semiconductor and a piezoelectric material are formed into a laminate using them as a substrate and a film provided thereon, respectively, for providing a monolithic formation so that it can improve the reproducibility and attain the advantages of integration.

The present invention has a further advantage that since the configuration of the electrode mounted on the surface of the piezoelectric material may be freely designed and it may be of a planar sheet, there is no need to subject the material to elaborate processing so long as it can produce a necessary space charge layer.

As the present invention accomplishes the conversion between an a.c. electrical signal and a surface signal wave utilizing a parametric effect, the frequency range can be widened so that the conversion can be effected even in a ultra high frequency band, with excellent efficiency, where conventional techniques cannot achieve the conversion.

Figure 2:
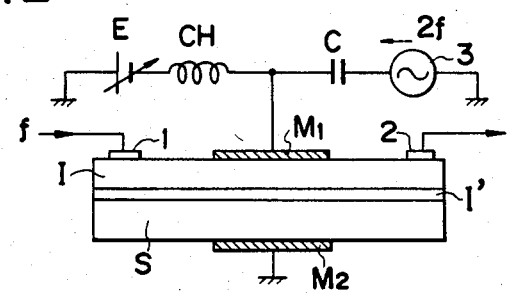
FIG. 2 is an electrical circuit diagram, showing an elastic surface wave amplifier in accordance with the present invention.

FIG. 2 shows another embodiment of the present invention, wherein the elastic surface wave device is applied to an amplifier. In the figure, like members are designated by like numerals or characters.

Figure 3:
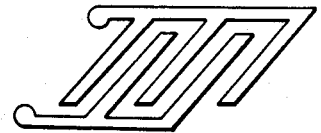
FIG. 3 shows one form of a comb electrode employable in the amplifier shown in FIG. 2.

Numerals 1 and 2 designate input and output means, respectively, for electrical signals, and they include comb electrodes as shown in FIG. 3. At the input means 1, an electrical signal is converted to an elastic surface wave, and at the output means 2 the surface signal wave is converted to an electrical signal.

An electrode $M_1$ is connected to high frequency power source 3 through a capacitor C for blocking d.c. current and through an inductor CH to a variable d.c. voltage source E, the high-frequency power source serving as a supply of pumping power.

The so constructed elastic surface wave amplifier in accordance with the present invention will operate as follows:

Upon supply of an electrical signal to the input means 1, the electrical signal is converted to a surface signal wave, which is then propagated at the surface portion of a piezoelectric material I towards the output means 2. The frequency of the surface signal wave being propagated is now assumed to be f. Then, when a pumping power having a frequency 2f is supplied to the electrode $M_1$ on the piezoelectric material I from a high-frequency power source 3 as well as a d.c. bias voltage from a d.c. power source E, the surface signal wave is amplified by a parametric interaction due to the surface charge layer capacitance nonlinearity at the surface portion of a semiconductor S under the electrode $M_1$. The so amplified surface signal wave is converted to an electrical signal by the output means 2 and drawn out.

The gain in the above-mentioned amplifying operation is expressed as a function of the length of the electrode $M_1$ in the propagation direction of the surface wave, the gain $\epsilon$ of the nonlinearity at the surface portion of the semiconductor substrate, and the frequency of the pumping power, etc. Accordingly, the gain can be varied by varying the values of the respective parameters.

The gain $\epsilon$ of the nonlinearity is determined by a surface charge layer capacitance nonlinearity of the semiconductor, which is in turn determined by a value of a d.c. bias voltage applied and the amount of the pumping power. Accordingly, in a practical application, these two parameters may be advantageously varied to regulate the gain.

Thus, in the elastic surface wave amplifier in accordance with the present invention, the amplification depends highly on the surface charge layer capacitance nonlinearity at the semiconductor substrate S of silicon etc. The effect due to this nonlinearity is by substantially superior as compared with that of the conventional technique which utilizes nonlinearity of the piezoelectric material itself, and results in various advantages sole that the required pumping power can be much reduced to obtain a given gain.

Figure 4:
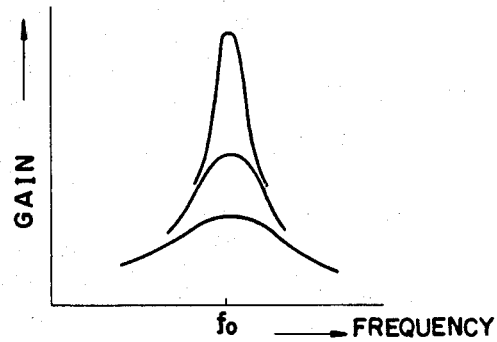
FIG. 4 is a diagram showing gain characteristics of the amplifier shown in FIG. 2, choosing Q as a parameter.

As the parameter amplifying effect of the elastic surface wave amplifier in accordance with the present invention is a kind of a positive feedback amplifying effect, an electrical quality factor Q is required to be improved to enhance the gain. One example of the frequency response of the gain with varying Q values is shown in FIG. 4. As apparent from the figure, a frequency bandwidth can be varied as well as the gain. Thus, the amplifier of the present invention further has a variable bandwidth-amplifying effect.

For supply of the pumping power having a frequency of 2f, one high-frequency power source 3 is employed in the embodiment shown in FIG. 2, but two or more high-frequency power sources may be employed so long as the beat frequency thereof is equal to 2f. For example, when high-frequency power sources having frequencies of $f_1$ and $f_2$, respectively, are employed, a power having frequency components of $f_1 \pm f_2$ and $nf_1 \pm mf_2$ is produced due to the nonlinearity at the surface portion of the semiconductor substrate.

If the frequency of the resulting power is equal to 2f, it can accomplish the amplification of the surface signal wave as when one high-frequency power source is employed.

Though the foregoing description is given referring only to the pumping power having a frequency 2f, the frequency of the pumping power is not limited to 2f and it may be 4f, 6f, 8f . . . .

In effect, however, the frequency of the pumping power is preferred to be 2f because the pumping power having a frequency 2f provides the maximum gain E of the nonlinearity. In this connection, it is to be noted that when the frequency of the pumping power is changed, the center frequency of the frequency band capable of being amplified is variable. In brief, the elastic surface wave amplifier in accordance with the present invention has a variable bandwidth-amplifying function. Accordingly, it can work also as a band pass filter variable in frequency bandwidth and center frequency.

Though, in the embodiment as shown in FIG. 2, the electrode $M_1$ is provided intermediate the input means 1 and the output means 2 and only the surface signal wave which is transmitted through the electrode $M_1$ and amplified is drawn out of the output means 2, the elastic surface wave amplifier in accordance with the present invention can essentially produce a reflected signal wave at a portion of the electrode $M_1$ as well as the transmitted signal wave and utilize the reflected wave signal for amplification effect as the transmitted signal wave. Accordingly, if the output is disposed intermediate the input means 1 and the electrode $M_1$, an electrical output can be drawn out by the reflected signal wave. In this case, however, it is required to employ a unidirectional elastic surface wave transducer as the output means.

The semiconductor to be employed may be either p-type or n-type. The polarity of the d.c. power source for the bias voltage is chosen depending on the type selected, namely, p-type or n-type so as to produce a space charge layer at a surface portion of the semiconductor.

The protective film I' on the surface of the semiconductor substrate S as illustrated in FIGS. 1 and 2 may be omitted if the piezoelectric film I is an insulator and there are not too many surface states between the protective film I' and the semiconductor substrate S.

Further it is to be noted that, instead of applying a d.c. bias voltage to the electrode $M_1$, a suitable impurity ion may be implanted into a superficial portion of the semiconductor substrate S in the vicinity of the protective film I' or the piezoelectric film I to produce a suitable space charge layer capacitance at the surface of the semiconductor substrate S. In this case, the capacity of the space charge layer capacitance may be controlled by selecting a kind or amount of ion to be implanted without externally applying a d.c. bias voltage. A power source for applying a d.c. bias voltage may also be omitted in the case where the space charge layer capacitance has a suitable capacity without external application of the bias voltage, according to the kind of an ion which happens to be mingled with the materials in the manufacturing process of the device, or an intrinsic property of the piezoelectric film employed.

Although the electrode $M_2$ is used as an ohmic electrode with respect to the semiconductor substrate S in the foregoing embodiments, if the specific resistance at a portion of the semiconductor substrate near the surface thereof on the side of the electrode $M_2$ is low, a contact impedance at a high frequency between the semiconductor substrate and the electrode $M_2$ is low and therefore the electrode for the ohmic contact is not required. In the present invention, the electrode $M_2$ may generally be made of a low resistance material such as electrified paste, electrified rubber, etc. as well as a metal.

In general, to vary the space charge layer capacitance at the surface of the semiconductor effectively by pumping, the specific resistance (resistivity) at the interfacial portion of the semiconductor is preferably large and therefore, a preferable range of the specific resistance is considered to be from several ohm centimeters to several hundred ohm centimeters. However, if bulk crystal having a large specific resistance is used as a semiconductor substrate, a large bulk resistance is put in the path of the pumping current and the pumping efficiency is undesirably lowered. To solve this problem, it is desirable to employ an epitaxial substrate having an epitaxial growth of a semiconductor layer having a large specific resistance on the bulk crystal having a small specific resistance.

Further it is to be noted that parametric acoustic wave generation is effected only where the amplification gain of the parametric amplification operation is large enough and the pumping power is higher than a certain threshold value. In this case, a component having a frequency f/2, half of the pumping frequency f, is markedly amplified and constantly outputted among waves occurring at a portion corresponding to the pumping electrode $M_1$ due to naturally existing thermal noise or other causes without application of an input of elastic surface wave signal. The threshold value of the pumping power is lowered as the nonlinear characteristic of the space charge layer capacitance at the semiconductor surface becomes stronger, as the length of the pumping electrode $M_1$ in the direction of travelling of the elastic surface wave becomes longer or as the pumping frequency f (or the frequency f/2) becomes higher. In case there is a reflection of the elastic surface wave in the travelling direction of the elastic surface wave, the larger the reflection coefficient is, the lower the threshold value of the pumping power is.

As the elastic surface wave amplifier in accordance with the present invention is so adapted that the surface wave signal may be amplified through the parametric amplification effect caused by supplying an a.c. pumping power from a high-frequency power source without causing a d.c. current to flow through the semiconductor, it has such an excellent effect that it can attain a continuous wave without Joule heat generation.

Further, as the present invention utilizes the surface charge layer nonlinearity of the conductor obtained by causing a surface charge layer capacitance formed at the surface portion of the semiconductor substrate to vary, layer nonlinearity effect can be expected and accordingly the pumping power necessary to obtain a given gain can be reduced.

Still further, as the present invention utilizes the parametric amplifying effect by the surface charge layer nonlinearity, undesirable noise generation due to a thermal noise derived from resistors etc. can well be eliminated and amplification can be accomplished with an excellent S/N ratio.

We claim:

1. An elastic surface wave parametric device comprising: a laminate composed of a semiconductor layer and a piezoelectric material layer disposed in confronting relationship; a first electrode means provided on the outer surface of said piezoelectric layer and on the propagating path of elastic surface waves in said laminate; a second electrode means for making ohmic contact to said semiconductor layer; and means for supplying a high frequency pumping electric power to said first and second electrode means so as to cause a surface charge layer capacitance formed at the confronting surface of said semiconductor layer to vary substantially to provide an amplifying parametric capacitive interaction with said surface waves and said pumping power.

2. An elastic surface wave device according to claim 1 wherein said high frequency pumping electric power is a continuous signal.

3. An elastic surface wave device according to claim 1 which further comprises a protective layer provided between said semiconductor layer and said piezoelectric material layer.

4. An elastic surface wave device according to claim 1 which further comprises input and output means for electrical signals present on spaced apart portions of said piezoelectric material layer.

5. An elastic surface wave device according to claim 1 wherein said pumping power contains at least one component having an even frequency multiple of that of an elastic surface wave provided in said piezoelectric material layer due to parametric interaction between said pumping power and said surface charge layer capacitance.

6. An elastic surface wave parametric device comprising: a laminate composed of a semiconductor layer and a piezoelectric material layer disposed in confronting relationship; a first electrode means on the outer surface of said piezoelectric material layer; a second electrode means for making ohmic contact to said semiconductor layer; a d.c. bias voltage source connected to said first and second electrode means; and a pumping power source connected to said first and second electrode means, said pumping power source being a continuous a.c. electric power signal, thereby causing a surface charge layer capacitance formed at the confronting surface of said semiconductor layer to continuously vary substantially to provide an amplifying parametric capacitive interaction with surface waves in said piezoelectric material layer and said pumping power.

7. An elastic surface wave device according to claim 1 wherein said pumping power contains at least one component having an even frequency multiple of that of an elastic surface wave provided in said piezoelectric material layer due to parametric interaction between said pumping power and said surface charge layer capacitance.

8. An elastic surface wave device according to claim 2 wherein the frequency of said one component is the double of that of said elastic surface wave.

9. An elastic surface wave device according to claim 1 wherein said piezoelectric material layer has input and output means for electrical signals disposed spacedly on its surface and in the propagating path of elastic surface waves, said first electrode means being disposed between said output means and said input means.

10. An elastic surface wave device according to claim 1 wherein impurity ions are doped into said laminate so as to provide a chosen surface charge layer capacitance.

11. An elastic surface wave device according to claim 1 wherein said piezoelectric material layer is an insulator.

12. An elastic surface wave device according to claim 1 wherein said semiconductor layer is an epitaxial semiconductor layer having a relatively lightly doped relatively thin layer confronting said piezoelectric material layer and a relatively heavily doped relatively thick outer layer.

13. An elastic surface wave device according to claim 1 wherein said pumping electric power a threshold amplitude value which causes an elastic surface wave to be produced.

* * * * *